United States Patent [19]

Saari

[11] 4,065,728
[45] Dec. 27, 1977

[54] CRYSTAL OSCILLATOR INCLUDING A PAIR OF PUSH-PULL COMPLEMENTARY TRANSISTOR AMPLIFIERS

[75] Inventor: Veikko Reynold Saari, Spring Lake Heights, N.J.

[73] Assignee: Bell Telephone Laboratories, Murray Hill, N.J.

[21] Appl. No.: 749,785

[22] Filed: Dec. 13, 1976

[51] Int. Cl.² .............................................. H03B 5/36
[52] U.S. Cl. ................................. 331/75; 331/108 D; 331/109; 331/114; 331/186; 331/116 R
[58] Field of Search ........... 331/116 R, 117 R, 108 A, 331/108 D, 109, 114, 75, 185, 186, 159

[56] References Cited

U.S. PATENT DOCUMENTS

| | | | |
|---|---|---|---|
| 3,585,526 | 6/1971 | Zelinka | 331/116 R X |
| 3,649,850 | 3/1972 | Davis | 331/116 R X |
| 3,855,552 | 12/1974 | Thanhaeuser | 331/116 R |
| 3,890,580 | 6/1975 | Kuhn, Jr. et al. | 331/159 X |
| 3,979,693 | 9/1976 | Saari | 331/116 R X |

OTHER PUBLICATIONS

Hansen et al., "Oscillator Circuit," IBM Technical Disclosure Bulletin, vol. 15, No. 8, Jan. 1973, pp. 2544, 2545.

Primary Examiner—Siegfried H. Grimm
Attorney, Agent, or Firm—D. E. Snedeker

[57] ABSTRACT

An improved integrated circuit oscillator adapted for crystal-controlled applications eliminates the need for capacitors and duty cycle control circuitry by using a cascaded pair of push-pull complementary transistor amplifier stages, a clipping-type automatic amplitude control circuit, and a resonant feed back path between the two amplifier stages. In an illustrative embodiment, floating bias voltages are established by a chain of diodes, with several bias currents set with respect to the chain current by emitter area relationships. Square-wave output is provided by a flip-flop connected to push-up and pull-down output circuits.

20 Claims, 3 Drawing Figures

CRYSTAL OSCILLATOR INCLUDING A PAIR OF PUSH-PULL COMPLEMENTARY TRANSISTOR AMPLIFIERS

BACKGROUND OF THE INVENTION

This invention relates to oscillator circuits and, more particularly, to crystal-controlled oscillator circuits amenable to integrated circuit manufacturing techniques.

A wide variety of oscillator circuits are known in the art, including crystal-controlled oscillator circuits, some of which are suitable in varying degrees for integrated circuit manufacture. A major difficulty has been to achieve a high level of integration without sacrificing such desirable characteristics as circuit simplicity, frequency range, frequency precision, and frequency and duty cycle stability. In the oscillator circuit disclosed in my U.S. Pat. No. 3,979,693 of Aug. 13, 1976, for example, clipping and duty cycle control circuitry are connected to the oscillator to provide a square-wave output signal having a 50 percent duty cycle. AGC circuitry is provided therein for controlling the oscillator gain to achieve amplitude and frequency stability. Both the duty cycle control and the AGC circuitry require filtering capacitors. Ideally, such an integrated circuit oscillator would include no capacitive or inductive elements (except for the resonant means), no special circuitry for duty cycle or frequency stability control, and no discrete external elements except perhaps for the resonant means, such as a piezoelectric crystal in the case of crystal-controlled oscillators.

SUMMARY OF THE INVENTION

A primary object of the present invention, therefore, is to provide an improved oscillator circuit suitable for integrated circuit manufacture and adapted for crystal-controlled applications.

A further object of the invention is to provide an improved integrated circuit oscillator having a substantially stable 50 percent duty cycle.

Yet another object of the invention is to provide, in a preferred embodiment, an improved integrated circuit crystal-controlled oscillator which does not require the use of any capacitive or inductive elements, nor of any special duty cycle control circuitry.

In an illustrative embodiment of an oscillator circuit according to my invention, the need for filtering capacitors and duty cycle control circuitry is eliminated via the use of a cascaded pair of push-pull complementary transistor amplifier stages and resonant means, preferably a piezoelectric crystal, connected in a feedback path between the two amplifier stages. The resonant path provides common-mode feedback around the complementary halves of the amplifier. The push-pull feature, in conjunction with the substantial level of the bias currents, maintains a high crystal Q and helps avoid spurious oscillations. A clipping arrangement connected to the amplifier provides automatic amplitude control.

More specifically, using the complementary transistor amplifier stages, a high degree of symmetry is maintained between the oscillator circuit supply points such that the oscillator tends naturally toward a substantially 50 percent duty cycle. This advantageously eliminates the cost and circuit complexity necessitated heretofore by the need for special duty cycle control circuitry. Further, the complementary transistors of each push-pull amplifier stage are serially interconnected via their emitters, thereby tending to reduce the manufacturing spread of offset voltages and thus to produce a relatively high manufacturing yield.

Bias voltages for the oscillator circuit are produced illustratively by a chain of diodes and resistors connected between the supply points. The bias voltages thus float in a precisely interlocked relationship. Several bias currents are established with respect to the current through the diode-resistor chain by emitter area relationships.

Output circuitry, for providing TTL output signals in an illustrative embodiment, utilizes a flip-flop connected between the oscillating circuit and a pair of output level circuits. The flip-flop action responsive to the oscillating circuit produces fast rise and fall of the output without excessive injection of current impulses into the supply points due to crossover currents arising from output level switching. The output level circuits may include respective push-up and pull-down transistors with suitable antisaturation circuitry for TTL output.

BRIEF DESCRIPTION OF THE DRAWING

The above and other objects and features of the invention may be fully apprehended from the following detailed description and the accompanying drawing, in which.

DETAILED DESCRIPTION

Figure 1:
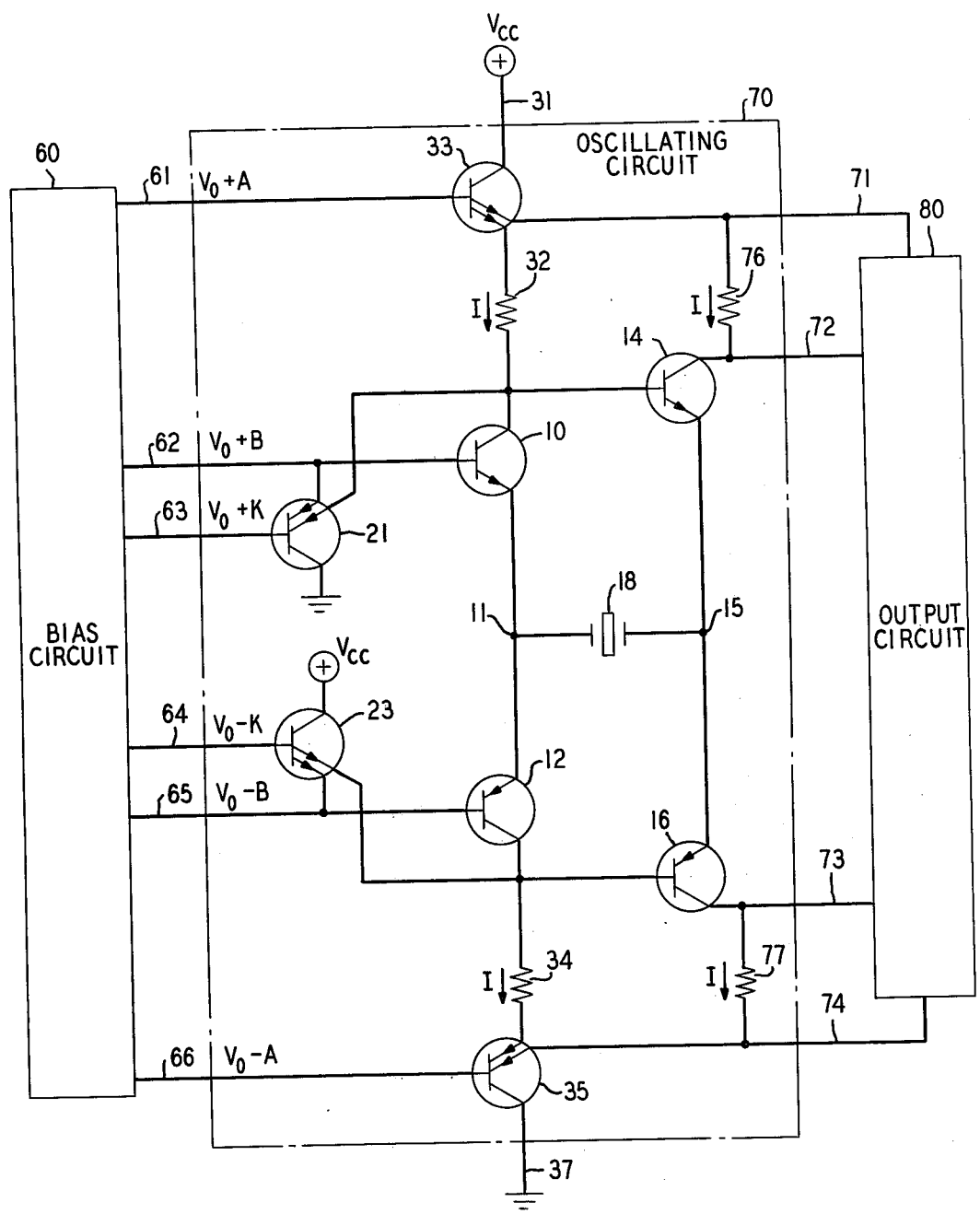
FIG. 1 shows an illustrative embodiment of a crystal-controlled oscillator circuit in accordance with the principles of the invention.

In the illustrative oscillator arrangement in FIG. 1, oscillating circuit 70 comprises a substantially zero phase shift amplifier having a push-pull common-base input stage including a pair of complementary transistors 10 and 12 and having a push-pull emitter-follower output stage including a pair of complementary transistors 14 and 16. Each complementary transistor pair is serially connected between respective supply potentials by way of paths 31 and 37, which potentials are, for example, positive potential supply source $V_{cc}$ and ground potential. The emitters of transistors 10 and 12 are interconnected via amplifier input junction 11; and the collectors thereof are connected to paths 31 and 37, respectively, and to the bases of transistors 14 and 16, respectively. Similarly, the emitters of transistors 14 and 16 are interconnected via amplifier output junction 15 and the collectors are connected to paths 31 and 37, respectively. A resonant feedback path, illustratively including piezoelectric crystal 18, is connected across the amplifier between junction 11 and junction 15. The feedback path provides varying phase shift to substantially null the small net phase shift of the amplifier stages. Oscillating circuit outputs are provided to output circuit 80 on leads 72 and 73 connected to the collectors of amplifier output transistors 14 and 16, respectively.

Transistors 21 and 23 function as a clipping arrangement to control the oscillation amplitude, and thus to help stabilize the oscillation frequency, by limiting the base voltage swings of amplifier output transistors 14 and 16. The purpose of the clipping arrangement is essentially to prevent the current through crystal 18 from reaching a level high enough to saturate any of the amplifier transistors. Transistors 21 and 23 each have a pair of emitters, one of which is connected to the base of a respective amplifier input transistor 10 or 12, and the other of which is connected to the base of a respective output transistor 14 or 16. The bases of transistors 21 and 23 are connected to bias paths 63 and 64, respectively, and the collectors thereof are connected to supply potentials $V_{cc}$ and ground, respectively.

Transistors 33 and 35 provide isolation between the amplifier signal current and bias circuit 60. The emitters of transistor 33 are connected via resistors 32 and 76, respectively, to the collectors of transistors 10 and 14, the collector of transistor 33 is connected to source $V_{cc}$ and the base is connected to bias path 61. Transistor 35 is connected similarly to the collectors of transistors 12 and 16 via resistors 34 and 77, to ground potential and to bias path 66.

Bias voltages and currents for operation of oscillating circuit 70 are established on bias paths 61–66 by bias circuit 60. In particular, substantially like magnitude bias currents are established in each of amplifier transistors 10, 12, 14 and 16, and relatively much smaller bias currents are provided to clipper transistors 21 and 23 so as not to strongly affect the small-signal gain of the amplifier. The quiescent potential at junctions 11 and 15 in oscillating circuit 70, referred to herein as potential $V_o$, is approximately midway between the supply potentials connected to paths 31 and 37. The bias voltages on paths 61–66 are provided by bias circuit 60 in substantially symmetrical pairs centered about potential $V_0$ such that the bias voltages on paths 61, 62 and 63 are displaced from potential $V_0$ by the same amount but in opposite directions as the bias voltages on paths 66, 65 and 64, respectively, as indicated in FIG. 1.

When bias is applied to oscillating circuit 70, amplifier transistors 10, 12, 14 and 16, as well as clipper transistors 21 and 23, are rendered conducting and oscillation is initiated via the feedback path through crystal 18. At the initiation of oscillation, the effective gain of the amplifier is greater than unity and may be on the order of two or three, for example, as determined principally by the relationship between resistors 32 and 34 and the resistance of amplifier transistors 10, 12, 14 and 16 along with crystal 18. As the amplitide of oscillation increases, it reaches a magnitude at which it starts to be limited over greater and greater portions of each oscillation cycle by clipper transistors 21 and 23. Consequently, the gain of the amplifier begins to decrease as the oscillation increases until the gain effectively drops to unity.

Figure 2:
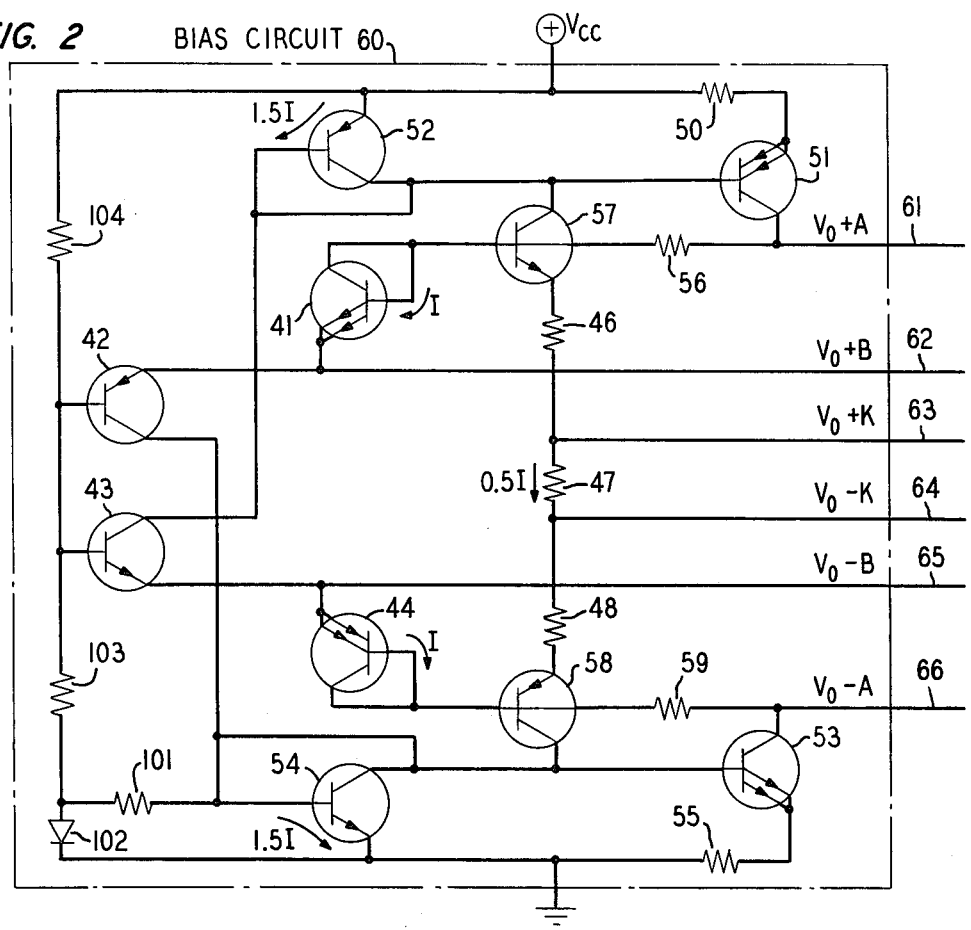
FIG. 2 shows an illustrative embodiment of circuitry for supplying suitable bias voltages and currents that may be employed in the oscillator circuit of FIG. 1.

An illustrative embodiment of bias circuit 60 is shown in FIG. 2 which essentially comprises a chain of four diode elements and two resistors connected between a pair of current sources. One current source includes transistors 51 and 52 connected to supply potential $V_{cc}$ and the other current source includes transistors 53 and 54 connected to ground potential. Transistor 52 is connected as a diode between supply $V_{cc}$ and the collectors of transistors 43 and 57, and transistor 54 is similarly connected between ground potential and the collectors of transistors 42 and 58. The collectors of transistors 51 and 53 are connected to bias paths 61 and 66, respectively; the bases thereof are connected to the collectors of transistors 43 and 42, respectively, and thus also to the collectors of transistors 57 and 58, respectively; and the emitters of transistors 51 and 53 are connected via respective resistors 50 and 55 to potentials $V_{cc}$ and ground, respectively.

The four diode elements in the chain include diode-connected transistor 41, the emitter-base junction of transistor 42, the base-emitter junction of transistor 43, and diode-connected transistor 44. The diode chain is connected to path 61 via resistor 56 and to path 66 via resistor 59, with path 62 connected in common to the emitters of transistors 41 and 42, and with path 65 connected in common to the emitters of transistors 43 and 44. It is particularly important in the illustrative bias circuit embodiment in FIG. 2 to ensure that the diode junction voltages are comparable at comparable emitter current values since these voltages are used to control the emitter currents of the various transistors. Thus, transistors 41 and 44, as well as transistors 52 and 54, although functioning as diodes, are depicted in FIG. 2 as transistors having their base and collector electrodes interconnected to illustrate suitable integrated circuit realization.

During operation of bias circuit 60, a bias current of value I flows between the current sources over the path through the diode chain, producing the depicted bias voltage on paths 61, 62, 65 and 66. The bias voltages on paths 62 and 65 differ plus and minus, respectively, from potential $V_0$ by a value B, which is determined by the forward voltage drop of one diode element biased at current I. Similarly, the bias voltages on paths 61 and 66 differ from potential $V_0$ by a value A, which is determined by the forward voltage drop of two diode elements and one resistor with current I.

The emitter junction bias voltages provided to clipper transistors 21 and 23 over paths 63 and 64 are set to be less than the emitter junction bias voltages of transistors 10, 12, 14 and 16, the difference from potential $V_0$ being a small fraction of value B but large enough to keep the currents in transistors 21 and 23 relatively small under small-signal conditions. This condition is determined principally in bias circuit 60 by transistors 57 and 58, along with resistors 46, 47 and 48 connected between the emitters thereof. The collectors of transistors 57 and 58 are connected to the collectors of transistors 43 and 42, respectively, the base of transistor 57 is connected to the junction of resistor 56 and transistor 41, and the base of transistor 58 is connected to the junction of resistor 59 and transistor 44. The collector currents of transistors 57 and 58 can represent a significant part of the currents in transistors 52 and 54, respectively. The bias voltages on paths 63 and 64 thus differ in magnitude fron the bias voltages extended on paths 62 and 65 by a fraction of a diode drop, and from potential $V_0$ by a value $k$ which is approximately one-half the voltage drop across resistor 47.

It may be noted at this point that the bias currents for clipper transistors 21 and 23 do not track the bias current value I. Consequently, transistors 21 and 23 each have been provided with a pair of emitters, those of transistor 21 being connected to the respective collectors of amplifier input transistor 10 and bias circuit transistor 42, and those of transistor 23 to the collectors of amplifier input transistor 12 and bias circuit transistor 43. This configuration reduces the bias currents in transistors 42 and 43, and hence transistors 10 and 12 also, by an amount comparable to that which the extra emitters of 21 and 23 draw from transistors 33 and 35. This makes the bias currents in resistors 32 and 34 and hence the bias currents in transistors 14 and 16 less sensitive to the usual manufacturing variations. Consequently, the bias voltages on paths 71-74 to output circuit 80, are maintained under control over a normal distribution of manufacturing parameters and over a wide operating temperature range.

Bias circuit 60 also includes resistor 101 and diode 102 (which may comprise a diode-connected transistor) functioning as a start-up circuit. Initially, upon energization of bias circuit 60 via the supply potentials, start-up current flowing through diode 102 in the path including resistors 103 and 104 induces small currents in transistors 54 and 53. The current induced initially in transistor 53 is larger than that induced in transistor 54 due to the larger emitter area of transistor 53, with the particular current relationship between transistors 53 and 54 being determined finally by emitter resistor 55. The current induced in transistor 53 pulls current through the path including transistors 43 and 44 and resistor 59, thereby forcing current through transistors 52, 51, 41 and 42 into transistor 54 as positive feedback. Current build-up continues in this manner until limited by emitter resistors 50 and 55 to the value I, which is essentially independent of the magnitude of supply potential $V_{cc}$ and which may be on the order of 1.2 mA, for example. By the time this happens, substantial current also flows in the path through transistors 57 and 58 and resistors 46, 47 and 48. This current adds to the currents in transistors 52 and 54 such that the latter settle to a value approximately equal to 1.5 I if the emitter areas of transistors 51 and 53 are assumed to be twice those of transistors 52 and 54, respectively, and resistors 50 and 54 are on the order of 24 ohms each. The current flowing in the path through transistors 57 and 58 settles to a value approximately equal to 0.5 I.

The symmetrical configuration of bias circuit 60 suggests that resistors 46 and 48 would typically be of like magnitude, as would resistors 56 and 59, and resistors 50 and 55. This is certainly true for most applications contemplated for the ocillator arrangement in FIG. 1. However, I have found that at higher frequencies, such as in the range of 20-32 MHz, operation of the oscillator may benefit from a small amount of imbalance in the bias voltages provided on paths 63 and 64 to limiter transistors 21 and 23. This appears to compensate for imbalance in the parasitic capacitances associated with NPN versus PNP transistors. Thus, for such applications, resistor 48 may be slightly larger in magnitude, e.g., on the order of 10-15 percent larger, than resistor 46.

Figure 3:
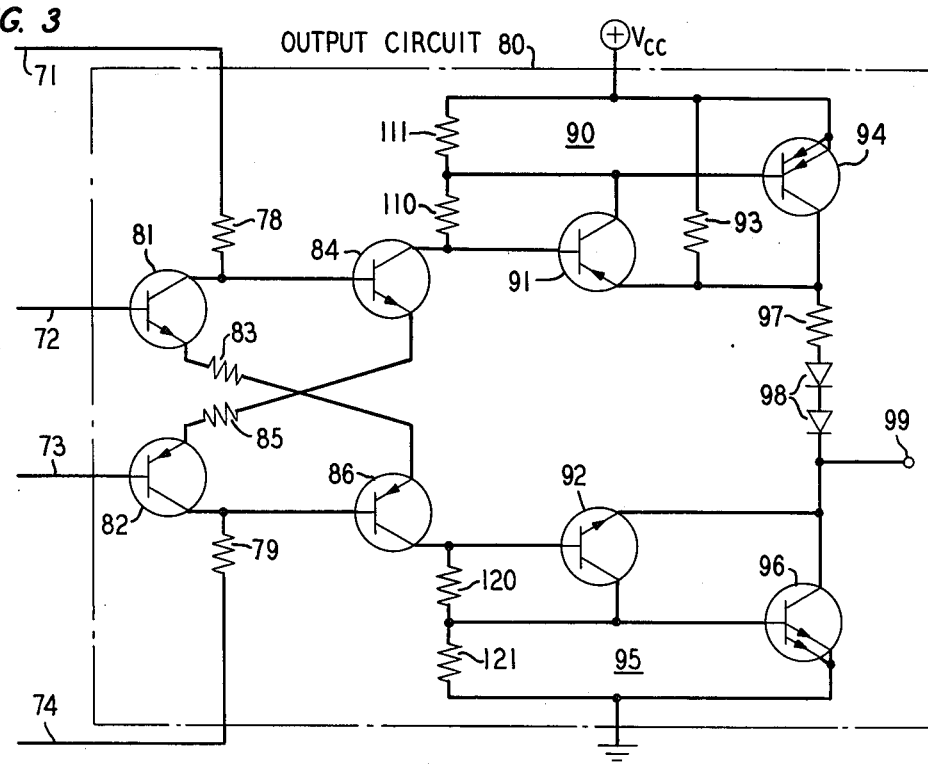
FIG. 3 depicts output circuitry suitable for providing square-wave output signals in response to an oscillating input that may be employed in the oscillator circuit of FIG. 1.

The output of oscillating circuit 70, as mentioned above is extended on leads 72 and 73 to output circuit 80, an illustrative embodiment of which for providing square wave TTL (transistor-transistor logic) output is shown in FIG. 3. Therein, a flip-flop arrangement of transistors 81, 82, 84 and 86, responsive to the oscillating circuit outputs on leads 72 and 73, alternately drives push-up circuit 90 and pull-down circuit 95 to generate the TTL output at terminal 99. The oscillating circuit outputs on leads 72 and 73 are connected to the respective bases of transistors 81 and 82, and the collectors of transistors 84 and 86 are connected to circuits 90 and 95, respectively. The emitters of transistors 81 and 86 are interconnected via resistor 83, and the emitters of transistors 82 and 84 are similarly interconnected via resistor 85. The collector of transistor 81 and the base of transistor 84 are connected through resistor 78 to bias voltage lead 71. The collector of transistor 82 and the base of transistor 86 are connected through resistor 79 to bias voltage lead 74.

Push-up and pull-down circuits 90 and 95 each comprise an output transistor 94 and 96 and a resistor 111 or 121. Resistors 111 and 121 connect the collector of a respective one of flip-flop transistors 84 and 86 to supply potential $V_{cc}$ and ground potential, respectively, by way of resistors 110 and 120, which are parts of antisaturation networks. The base of push-up output tranistor 94 is connected to the junction of resistors 110 and 111, the collector is connected to output terminal 99, and the emitter is connected to supply potential $V_{cc}$. Pull-down output transistor 96 is connected in similar fashion to resistors 120 and 121, to output terminal 99, and to ground potential.

During operation of output circuit 80, push-up transistor 94 and pull-down transistor 96 are prevented from going into saturation by transistors 91 and 92 and resistors 110 and 120. Transistors 91 and 92 are connected across the respective base-collector paths of transistors 94 and 96, with the small voltage drops across resistors 110 and 120 providing the margins against saturation. Resistor 97, connected between push-up circuit 90 and output terminal 99, serves to limit the push-up current for inadvertent short-circuit loads, and diodes 98 serve to help maintain a 50 percent duty cycle by causing the high and low output levels to straddle the decision level almost evenly. The rise and fall times of the output might otherwise increase the duty cycle at the higher oscillation frequencies. Resistor 93, connected in parallel with transistor 94, functions to maintain a small bias current in diodes 98 during the zero output state at terminal 99.

A principal advantage of using the illustrative flip-flop arrangement in output circuit 80 is that it tends to reduce or suppress the current impulses injected into supply $V_{cc}$ and ground as the output switches. It may be observed that the flip-flop arrangement does not switch from one state to the other immediately upon the equal potential point being crossed on leads 72 and 73, but rather the differential input to flip-flop transistors 81 and 82 must swing considerbly past zero before switching takes place. The fact that amplifier transistors 14 and 16 alternately cut off during push-pull operation insures that switching will actually occur, and the symmetry of the circuitry substantially maintains the desired 50 percent duty cycle.

What has been described hereinabove is but illustrative of the principles of my invention. It will be appreciated, for example, that although the above description of output circuit 80 assumes a TTL output, for certain applications it may be desirable to let the output at terminal 99 swing nearly to the supply potential $V_{cc}$, which may be as high as 12 volts. The illustrative output circuit embodiment in FIG. 3 can be modified readily for such applications by shorting out resistor 97 and diodes 98 and by providing circuitry to help prevent emitter-junction breakdown of transistors 91 and 92 when the output at terminal 99 rises above 8 volts. The latter may be accomplished, for example, by inserting a forward-poled diode between the emitter of transistor 92 and output terminal 99, by separating the tiepoint between resistor 120 and the collector of transistor 92 from the tiepoint between resistor 121 and the base of transistor 96 and connecting a diode between these two tiepoints (poled toward the base of transistor 96), and by interchanging the emitter and collector of transistor 91.

Further, oscillating circuit 70 can be modified quite simply for VCO (voltage controlled oscillator) applications by connecting a varactor diode in series with crystal 18 between junctions 11 and 15, and at the same time suitably reducing the crystal current magnitude. The latter can be effected, for example, by reducing the gain of the oscillating loop via bias circuit 60 by connecting a current source transistor in parallel with transistors 41 and 51 between source $V_{cc}$ and path 62. This will inject extra current into transistor 42, thereby increasing the bias currents of transistors 10 and 12 slightly. Due to the greater voltage drops then occurring across resistors 32 and 34, the bias currents of amplifier output transistors 14 and 16 are reduced substantially by reducing the differential voltage applied to transistors 14 and 16. At the same time, the magnitude of resistors 76 and 77 can be increased to ensure strong outputs on leads 72 and 73.

Moreover, for VCO and other applications where a high degree of frequency precision is not required, crystal 18 can be replaced with other well known types of resonators or resonant circuits. Numerous and varied other arrangements for bias circuit 60, oscillating circuit 70 and output circuit 80 may be derived by those skilled in the art without departing from the spirit and scope of the invention.

What is claimed is:

1. An oscillator comprising
   a first push-pull non-inverting amplifier stage including a first pair of serially-connected complementary transistors,
   a second push-pull non-inverting amplifier stage connected to said first stage and including a second pair of serially-connected complementary transistors,
   resonant feedback path means connected between said first and second amplifier stages,
   and means connected to at least one of said amplifier stages for controlling the oscillation amplitude of said oscillator.

2. An oscillator according to claim 1 wherein said first pair of transistors are connected in common-base configuration and wherein said second pair of transistors are connected in emitter-follower configuration, said resonant feedback path means being connected between the emitters of said first pair of transistors and the emitters of said second pair of transistors.

3. An oscillator according to claim 2 wherein said oscillation amplitude controlling means comprises a pair of clipper transistors, means for connecting one of said clipper transistors to the base of one of said pair of transistors in at least one of said amplifier stages, and means for connecting the other of said clipper transistors to the base of the other one of said pair of transistors in said one amplifier stage.

4. An oscillator according to claim 3 wherein said resonant feedback path means comprises a piezoelectric crystal.

5. An oscillator according to claim 1 wherein said oscillation amplitude controlling means comprises means for preventing said amplifier stage transistors from going into saturation.

6. An oscillator according to claim 5 further comprising bias circuit means connected to said first and second amplifier stages and to said amplitude controlling means,
   means for isolating said bias circuit means from the oscillating signal current in said amplifier stages, and
   output circuit means connected to said second amplifier stage.

7. An oscillator according to claim 6 wherein said bias circuit means includes means for establishing substantially like magnitude bias currents in each transistor of said first and second pair.

8. An oscillator according to claim 7 wherein said bias circuit means comprises a chain of diode and resistor elements serially connected between first and second current sources for providing at the junctions between said elements a series of bias voltages having a predetermined relationship therebetween.

9. An oscillator according to claim 8 wherein said resonant feedback path means comprises a piezoelectric crystal.

10. An oscillator according to claim 9 wherein said oscillation amplitude controlling means includes a pair of clipper transistors individually connected to the bases of respective ones of said second pair of amplifier stage transistors, and wherein said bias circuit means further comprises means for providing bias currents to said clipper transistors of a magnitude substantially smaller than said bias currents established in said first and second pairs of amplifier stage transistors.

11. An oscillator according to claim 1 further comprising an output terminal, and output circuit means connected to said second amplifier stage for supplying a square-wave output signal to said output terminal.

12. An oscillator according to claim 11 wherein said output circuit means includes flip-flop means having a pair of inputs individually connected to respective ones of said second pair of transistors and having a pair of outputs connected to said output terminal.

13. An oscillator according to claim 12 wherein said output circuit means further includes a push-up circuit connecting one of said outputs to said output terminal and a pull-down circuit connecting the other of said outputs to said output terminal.

14. An oscillator according to claim 12 wherein said output circuit means further includes a pair of output transistors respectively connecting said pair of outputs to said output terminal, the bases of said output transistors being individually connected to respective ones of said outputs and the collectors of said output transistors being connected in common to said output terminal.

15. An oscillator according to claim 14 wherein said output circuit means further includes means for preventing saturation of said output transistors.

16. An oscillator comprising
    a first amplifier stage including a first pair of complementary transistors having their emitters interconnected,
    a second amplifier stage including a second pair of complementary transistors having their emitters interconnected,
    means individually connecting the collector of each of said first pair of transistors to the base of a corresponding one of said second pair of transistors,
    resonant feedback path means connected between said emitters of said first pair of transistors and said emitters of said second pair of transistors,
    output means connected to the collectors of said second pair of transistors,
    means for biasing said first and second amplifier stages, and means connected to at least one of said amplifier stages for controlling the amplitude of oscillation of said oscillator.

17. An oscillator according to claim 16 wherein said oscillation amplitude controlling means comprises a third pair of transistors each having an emitter thereof connected to the base of a respective one of said second pair of transistors, and wherein said biasing means includes means for biasing said third pair of transistors.

18. An oscillator according to claim 17 wherein said third pair of transistors each have a second emitter thereof connected to the base of a respective one of said first pair of transistors.

19. An oscillator according to claim 18 wherein said output means comprises a fourth pair of complementary transistors having their emitters interconnected, a fifth pair of complementary transistors having their emitters interconnected, means connecting the collector of a first one of said fourth pair of transistors to the base of a first one of said fifth pair of transistors, means connecting the base of the other one of said fourth pair of transistors to the collector of the other one of said fifth pair of transistors, means connecting the base of said first one of said fourth pair to the collector of one of said second pair of transistors, and means connecting the base of the other one of said fifth pair to the collector of the other one of said second pair of transistors.

20. An oscillator according to claim 19 wherein said output means further comprises an output terminal, a first output transistor having its base connected to the collector of said first one of said fifth pair of transistors and having its collector connected to said output terminal, and a second output transistor having its base connected to the collector of said other one of said fourth pair of transistors and having its collector connected to said output terminal.

* * * * *